United States Patent
Bennett et al.

(10) Patent No.: US 9,582,353 B2
(45) Date of Patent: Feb. 28, 2017

(54) METHOD OF PERFORMING ERROR-CORRECTION OF NUCLEAR MAGNETIC RESONANCE DATA

(71) Applicant: Schlumberger Technology Corporation, Sugar Land, TX (US)

(72) Inventors: Nicholas N. Bennett, Hamden, CT (US); Lalitha Venkataramanan, Lexington, MA (US); Nicholas Heaton, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 111 days.

(21) Appl. No.: 14/374,429

(22) PCT Filed: Jan. 30, 2013

(86) PCT No.: PCT/US2013/023782
§ 371 (c)(1),
(2) Date: Jul. 24, 2014

(87) PCT Pub. No.: WO2013/116294
PCT Pub. Date: Aug. 8, 2013

(65) Prior Publication Data
US 2014/0380134 A1    Dec. 25, 2014

Related U.S. Application Data

(60) Provisional application No. 61/592,380, filed on Jan. 30, 2012.

(51) Int. Cl.
*H03M 13/00* (2006.01)
*G06F 11/10* (2006.01)
(Continued)

(52) U.S. Cl.
CPC ............... *G06F 11/10* (2013.01); *G01V 3/14* (2013.01); *G01V 3/32* (2013.01); *H04B 7/24* (2013.01); *G01R 33/4625* (2013.01)

(58) Field of Classification Search
None
See application file for complete search history.

(56) References Cited

U.S. PATENT DOCUMENTS 5,363,041 A    11/1994    Sezginer
5,381,092 A    1/1995    Freedman
(Continued)

OTHER PUBLICATIONS

International Search Report for International Application No. PCT/US2013/023782 dated May 14, 2013.
(Continued)

*Primary Examiner* — Daniel McMahon

(57) ABSTRACT

A method of obtaining nuclear magnetic resonance (NMR) data from a subterranean formation may include operating a tool in a subterranean formation for generating both NMR data and NMR scaled data based upon NMR measurements of the subterranean formation. The method also includes operating the tool for encoding and transmitting both the NMR data and NMR scaled data, and receiving and decoding, above the subterranean formation, both the NMR data and NMR scaled data from the tool. The method also includes performing error-correction of the received and decoded NMR data based upon the received and decoded NMR scaled data.

11 Claims, 6 Drawing Sheets

(51) Int. Cl.
*G01V 3/32* (2006.01)
*G01V 3/14* (2006.01)
*H04B 7/24* (2006.01)
*G01R 33/46* (2006.01)

(56) References Cited

U.S. PATENT DOCUMENTS

| | | | |
|---|---|---|---|
| 6,184,681 B1 | 2/2001 | Heidler et al. | |
| 6,405,136 B1 | 6/2002 | Li et al. | |
| 6,618,322 B1* | 9/2003 | Georgi | G01V 1/46 |
| | | | 181/105 |
| 7,821,260 B2 | 10/2010 | Hamdan et al. | |
| 8,022,698 B2 | 9/2011 | Rottengatter et al. | |
| 8,274,399 B2 | 9/2012 | Strachan et al. | |
| 2004/0008027 A1 | 1/2004 | Prammer | |
| 2004/0154831 A1 | 8/2004 | Seydoux et al. | |
| 2004/0257241 A1* | 12/2004 | Menger | E21B 47/01 |
| | | | 340/854.3 |
| 2005/0012637 A1* | 1/2005 | Golla | G01V 11/002 |
| | | | 340/853.3 |
| 2006/0273787 A1* | 12/2006 | Blanz | G01N 24/081 |
| | | | 324/303 |
| 2007/0036202 A1* | 2/2007 | Ge | H04B 1/71052 |
| | | | 375/141 |
| 2009/0192711 A1 | 7/2009 | Tang | |
| 2009/0198446 A1 | 8/2009 | Hursan | |
| 2010/0245121 A1 | 9/2010 | Reed et al. | |
| 2011/0005835 A1 | 1/2011 | Li | |
| 2011/0072330 A1* | 3/2011 | Kolze | H03M 13/1515 |
| | | | 714/758 |
| 2012/0001776 A1 | 1/2012 | Yu et al. | |
| 2012/0054586 A1* | 3/2012 | Panteleev | H03M 13/152 |
| | | | 714/785 |

OTHER PUBLICATIONS

Communication pursuant to Article 94(3) EPC for EP Application No. 13743156.5 dated Oct. 13, 2015.
Supplementary European Search Report for EP Application No. 13743156.5 dated Sep. 29, 2015.

* cited by examiner

METHOD OF PERFORMING ERROR-CORRECTION OF NUCLEAR MAGNETIC RESONANCE DATA

BACKGROUND

Well placement has been developed over the years by providing logging while drilling (LWD) measurements at the surface or above the subterranean formation in real time, starting with gamma ray and resistivity logs, and more recently deeper directional electromagnetic measurements. In addition, there has been increasing interest in providing additional formation evaluation data at the surface in real time, such as, for example, nuclear magnetic resonance (NMR) echo train measurements. The NMR measurements can provide information concerning porosity, the distribution of pore sizes, fluid typing, and fluid composition. NMR echo train measurements are very high dimensional and may include both Carr, Purcell, Meiboom, and Gill (CPMG) and enhanced precision mode (EPM) burst measurements that include thousands of echoes.

To make these NMR echo measurements available at the surface in real time, compression algorithms may be used to convert the NMR data into a bitstream that can be transmitted to the surface using, for example, a mud-pulse telemetry system. These compression algorithms may employ entropy encoding. Because of this entropy encoding, these bitstreams may be susceptible to various types of transmission errors that can cause errors in the NMR data reconstructed at the surface.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A method of obtaining nuclear magnetic resonance (NMR) data from a subterranean formation may include operating a tool in a subterranean formation for generating both NMR data and NMR scaled data based upon a plurality of NMR measurements of the subterranean formation. The method may also include operating the tool in the subterranean formation for encoding and transmitting both the NMR data and NMR scaled data, and receiving and decoding, above the subterranean formation, both the NMR data and NMR scaled data encoded and transmitted from the tool. The method may also include performing error-correction of the received and decoded NMR data based upon the received and decoded NMR scaled data.

A system aspect is for obtaining nuclear magnetic resonance (NMR) data from a subterranean formation. The system includes a tool positioned in a subterranean formation to generate both NMR data and NMR scaled data based upon a plurality of NMR measurements of the subterranean formation, and encode and transmit both the NMR data and NMR scaled data. The system also includes a controller positioned above the subterranean formation to receive and decode both the NMR data and NMR scaled data encoded and transmitted from the tool, and perform error-correction of the received and decoded NMR data based upon the received and decoded NMR scaled data.

A non-transitory computer readable medium aspect is for obtaining nuclear magnetic resonance (NMR) data from a subterranean formation. The non-transitory computer-readable medium has computer-executable instructions for decoding, above the subterranean formation, both NMR data and NMR scaled data that is encoded and transmitted from a tool operated in a subterranean formation. The tool generates both the NMR data and the NMR scaled data based upon NMR measurements of the subterranean formation. The computer-executable instructions perform error-correction of the received and decoded NMR data based upon the received and decoded NMR scaled data.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout.

Figure 1:
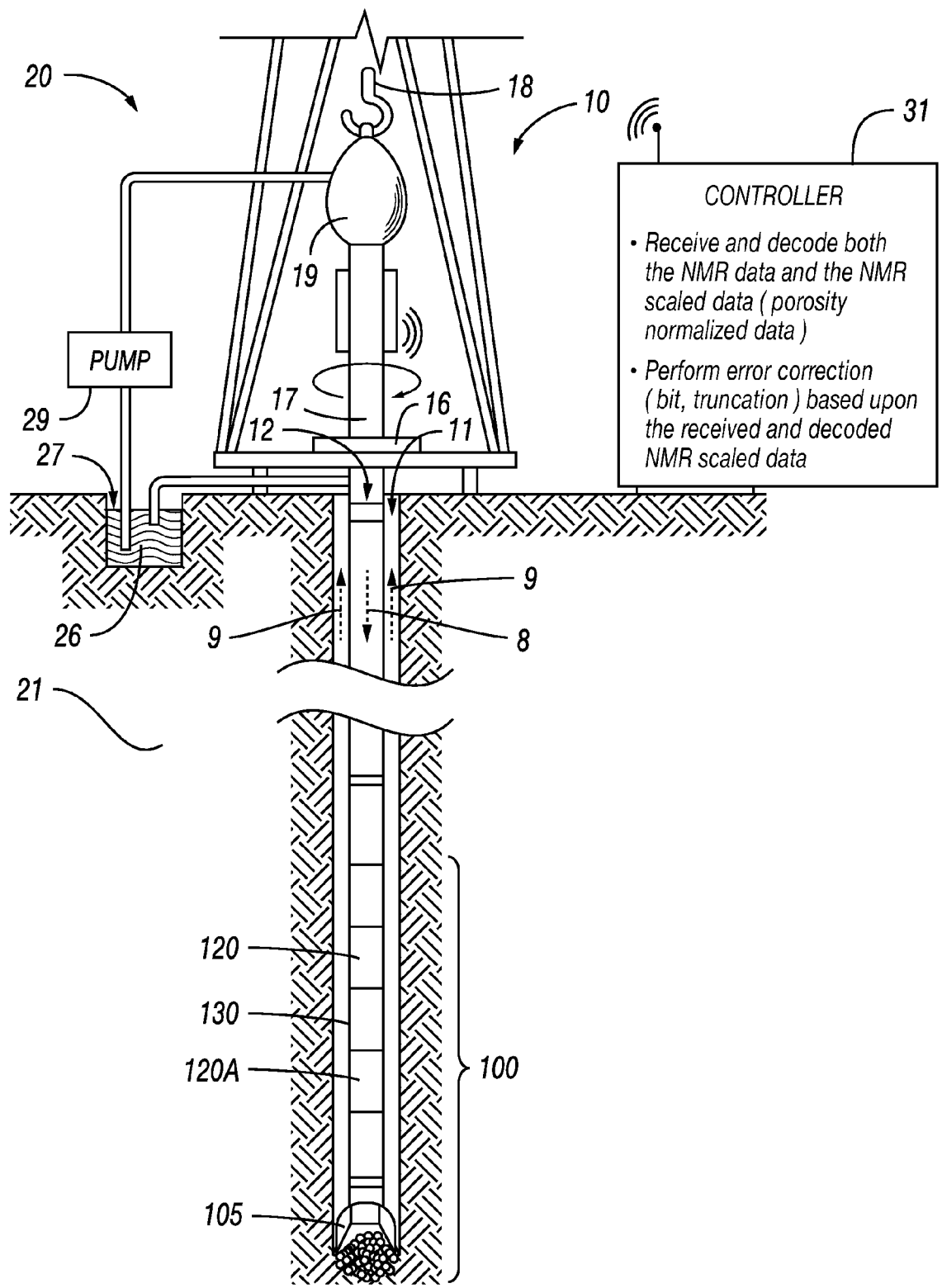
FIG. 1 is a schematic diagram of a subterranean a well logging system for use with a method in accordance with an embodiment.
Figure 2:
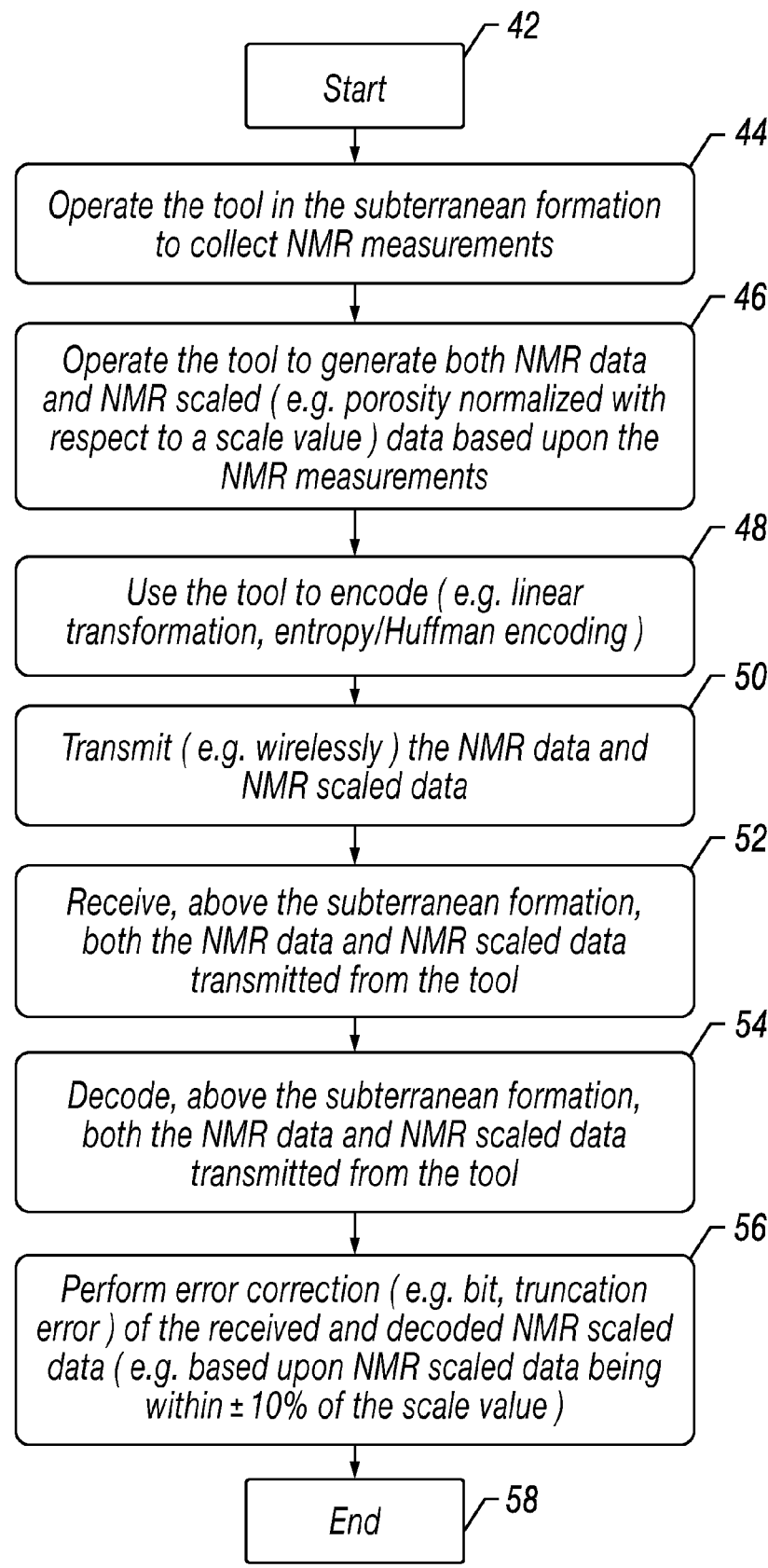
FIG. 2 is a flowchart of obtaining nuclear magnetic resonance (NMR) data in a subterranean formation in accordance with an embodiment.

Referring initially to FIG. 1 and the flowchart 40 in FIG. 2, a system 20 and corresponding method of obtaining nuclear magnetic resonance (NMR) data from a subterranean formation 21 is described.

The wellsite system 20 may be onshore or offshore, for example. A borehole 11 is formed in the subterranean formation 21, for example, by rotary drilling. Of course, the borehole 11 may be formed in the subterranean formation 21 using other techniques, for example, directional drilling.

A drill string 12 is suspended within the borehole 11 and has a bottom hole assembly 100 or tool which includes a drill bit 105 at its lower end. The system 20 includes a platform and derrick assembly 10 positioned over the borehole 11. The assembly 10 includes a rotary table 16, a kelly 17, a hook 18, and a rotary swivel 19. The drill string 12 is rotated by the rotary table 16 and energized to engage the kelly 17 at the upper end of the drill string. The drill string 12 is suspended from the hook 18, attached to a traveling block, through the kelly 17 and the rotary swivel 19 which permits rotation of the drill string relative to the hook. A top drive system could alternatively be used.

Drilling fluid or mud 26 may be stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole 11, as indicated by the directional arrows 9. The drilling fluid lubricates the drill bit 105 and carries subterranean formation cuttings to the surface to be returned to the pit 27 for recirculation.

The bottom hole assembly 100 or tool includes a logging-while-drilling (LWD) module 120, a measuring-while-drilling (MWD) module 130, a roto-steerable system and motor, and drill bit 105. The LWD module 120 is carried by a drill collar and may include one or more logging tools. Of course, more than one LWD and/or MWD module may be used, for example, as illustrated. It should be noted that references made herein to a module at the position 120 may alternatively correspond to a module at the position of 120A. The LWD module 120 includes capabilities for measuring, processing, and storing information, and for communicating with the surface equipment. The LWD module 120 may include an NMR measuring device.

The MWD module 130 is also carried by a drill collar, and may include one or more devices for measuring characteristics of the drill string and drill bit. The MWD tool or module 130 may further include a device for generating electrical power to the downhole system, for example, a mud turbine generator powered by the flow of the drilling fluid. Of course, other types of power and/or battery systems may be used. The MWD module 130 may include one or more of the following types of measuring devices: a weight-on-bit measuring device, a torque measuring device, a vibration measuring device, a shock measuring device, a stick slip measuring device, a direction measuring device, and an inclination measuring device.

Measurements from the measuring devices of the LWD and/or MWD modules 120, 130 may be sent, for example, wirelessly via wireless communications circuitry, to the surface for processing. For example, a controller 31 may control and log the measurements. The controller 31 may be in the form of one or more processors and a memory coupled thereto, and may include a database, for example. While a particular tool 100 has been described herein, it should be appreciated that a tool may include more or less components described above.

Beginning at Block 42, the tool 100 is operated in a subterranean formation 21, and more particularly, the borehole 11, to collect NMR measurements (Block 44). The tool 100, while positioned in the subterranean formation 21 generates both NMR data and NMR scaled data based upon the NMR measurements of the subterranean formation (Block 46). In some embodiments, the NMR scaled data includes porosity-scaled data, which may be normalized, for example, that is, scaled to a scale value of 1. In other embodiments, other types of NMR data may be collected, and scale values other than 1 may be used.

The tool 100 encodes (Block 48) and transmits (Block 50), for example wirelessly, both the NMR data and NMR scaled data (e.g., NMR porosity data and NMR porosity scaled data) to above the subterranean formation to the controller 31. In some embodiments, the tool 100 may transmit both the NMR data and the NMR scaled data via a wired interface.

The tool 100 encodes the NMR scaled data by performing a transformation, which may be a linear transformation, for example, to generate corresponding transform coefficients. The transform coefficients are then entropy encoded, for example, Huffman encoded, to generate code words.

The controller 31, which is positioned above the subterranean formation 21, receives (Block 52) and decodes (Block 54) both the NMR data and NMR scaled data encoded and transmitted from the tool 100 below the subterranean formation. Indeed, when the encoded NMR data, including the code words, is transmitted to above the subterranean formation 21 and received by the controller 31, errors may be introduced, as described in further detail below.

The controller 31 performs error-correction of the received and decoded NMR data based upon the received and decoded NMR scaled data (Block 56). The controller 31 may perform one or more of bit error correction, or a truncation error correction, as described in further detail below. The controller 31 may perform the error-correction based upon the decoded NMR scaled data being within ±10% of the scale value, for example. In some embodiments, the controller 31 may perform the error-correction based upon the decoded NMR scaled data being within ±5% of the scale value. The method ends at Block 58.

Further details and examples of the embodiments are now described. NMR measurements are collected from the tool 100, for example, an NMR echo train measurement. The NMR echo train measurement is separated into two components: (a) the NMR porosity; and (b) the porosity-normalized NMR echo data. The NMR echo train measurement transmission may be separated because, for example, during drilling operations, NMR porosity may be used to derive other subterranean formation evaluation information.

Separating the NMR echo train measurements into NMR porosity and porosity-normalized NMR data may be accomplished by first representing the NMR echo measurements with a vector d within a linear system of equations shown in Equation 1.

$$d = K f_{T_2} \qquad \text{Equation 1}$$

The vector $f_{T_2}$ may describe the distribution of $T_2$ relaxation times of the fluid components in the pore space of the subterranean formation, and K is the kernel matrix describing the linear relationship between the vectors d and $f_{T_2}$.

The NMR porosity $\phi$ may then be estimated by solving Equation 1 for the vector $f_{T_2}$ using, for example, a least squares technique and then adding together the entries of the vector as in Equation 2.

$$\phi = \int_0^\infty f_{T_2}(T_2) dT_2 \qquad \text{Equation 2}$$

The porosity normalized NMR data may then be obtained by dividing the entries of the vector d by the estimated NMR porosity $\phi$, as in $d/\phi$. These porosity-normalized NMR data may then be scaled according to an arbitrary but fixed constant, for example, the constant 1 or, as another example, 100 porosity units (p.u.).

A consequence of separating the NMR echo train measurement transmission is that, at the surface or above the subterranean formation 21, reconstructed porosity-normalized CPMG data should have values approximately equal to the scale value 1 at relatively early echo times. Alternatively, the porosity estimated from the reconstructed porosity-normalized NMR data may have values approximately equal to the scale value 1. This property can be used to correct at least two of the most common types of transmission errors including truncation errors and bit errors, as described below.

A truncation error may occur because during LWD operations, a fixed number of bits may be typically allocated to compress the NMR measurements so that a particular codeword may not be completely transmitted.

To describe a truncation error, the procedure for processing a set of transform coefficients, for example, singular value decomposition (SVD) transform coefficients is described with reference to Table 1. The SVD transform coefficients shown in Column 2 of Table 1 may be computed by first decomposing the kernel matrix K described in Equation 1 into its SVD decomposition $K=USV^1$. The SVD transform coefficients are then obtained by multiplying the SVD matrix U by the vector d/ϕ of porosity-normalized NMR data, as described by U d/ϕ. When a set of SVD transform coefficients are converted into a bitstream, each SVD transform coefficient is divided by a step size (that may depend on the SVD coefficient ID) and rounded to the nearest integer. This unconstrained symbol value refers to an entry in the corresponding Huffman coding table.

TABLE 1

| SVD Coeff ID | SVD Coeff | Step Size | Unconstrained Symbol Value | Min Symbol Value | Max Symbol Value | Codeword |
|---|---|---|---|---|---|---|
| 1 | −9.8671 | 0.488 | −20 | −67 | −4 | 110000 |
| 2 | −9.6782 | 0.508 | −19 | −31 | 32 | 001101 |
| 3 | −2.6834 | 0.719 | −4 | −17 | 14 | 01110 |
| 4 | −1.2216 | 0.346 | −9 | −13 | 18 | 11010 |
| 5 | −0.0461 | 0.463 | 0 | −8 | 7 | 1001 |
| 6 | 0.0844 | 0.456 | 0 | −7 | 8 | 1000 |
| 7 | −0.2730 | 0.837 | 0 | −3 | 4 | 100 |

Table 2 below shows the Huffman table for SVD coefficient 4.

TABLE 2

| Symbol Value | Huffman Codeword |
|---|---|
| −14 | 0 0 0 1 0 1 0 0 0 |
| −13 | 0 0 0 1 0 1 0 0 1 |
| −12 | 0 0 0 1 0 1 1 |
| −11 | 1 0 0 1 0 0 0 |
| −10 | 1 1 0 1 1 |
| −9 | 1 1 0 1 0 |
| −8 | 0 1 1 0 |
| −7 | 0 0 0 0 |
| −6 | 0 0 1 0 |
| −5 | 1 0 1 1 |
| −4 | 0 1 1 1 |
| −3 | 1 1 1 0 |
| −2 | 1 1 0 0 |
| −1 | 1 0 1 0 |
| 0 | 0 1 1 1 |
| 1 | 0 0 1 1 |
| 2 | 0 1 0 0 |
| 3 | 0 1 0 1 |
| 4 | 1 0 0 0 |
| 5 | 0 0 0 1 1 |
| 6 | 1 0 0 1 1 1 |
| 7 | 1 0 0 1 0 1 |
| 8 | 1 0 0 1 0 0 1 1 |
| 9 | 0 0 0 1 0 0 |
| 10 | 1 0 0 1 1 0 0 |
| 11 | 1 0 0 1 1 0 1 1 |
| 12 | 1 0 0 1 1 0 1 0 1 |
| 13 | 0 0 0 1 0 1 0 1 0 |
| 14 | 0 0 0 1 0 1 0 1 1 |
| 15 | 1 0 0 1 0 0 1 0 0 |
| 16 | 1 0 0 1 0 0 1 0 1 |
| 17 | 1 0 0 1 1 0 1 0 0 |

Suppose that the decoded bitstream includes the first three codewords described in Table 1 along with a portion of the fourth codeword:

110000 001101 01110 110

The '110' is enough information to infer that one of the three symbols highlighted or bolded above is being transmitted as the fourth SVD coefficient. This issue is referred to as a truncation error. The possible bitstreams that are consistent with the received bitstream can be enumerated similarly to the handling of the bit errors.

| Candidate #1: | 110000 001101 01110 110 1 1 |
| Candidate #2: | 110000 001101 01110 110 1 0 |
| Candidate #3: | 110000 001101 01110 110 0 |

The NMR data from these three bitstreams can be reconstructed and the corresponding values of porosity may be computed. These values of porosity may then be used to help distinguish which candidate codeword was actually transmitted as SVD Coefficient #4.

At the surface, the controller 31, which may include decoder circuitry, determines if the portion of the bitstream corresponding to the last codeword has been truncated. If that is the case, the decoder's symbol frequency table could be used to estimate the last codeword from the truncated codeword. This estimation may lead to porosity normalized NMR data reconstructions where the CPMG data does not have early time values close to 1, for example, as illustrated in the graph 70 in FIG. 3. In the graph 70 the CPMG data 71 was reconstructed from a bitstream where the final codeword was determined to be candidate bitstream #3 using the symbol frequency table. Unlike the original (porosity-normalized) CPMG data 72, the reconstructed CPMG data has relatively early time values that are far from 1. The curves 76 and 77 represent the CPMG echo data reconstructed from the candidate bitstreams #1 and #2. For this example, the truncation error correction mechanism produces the error corrected NMR data by averaging together the NMR data associated with candidate bitstreams #1 and #2.

An additional example of correcting truncation errors is now discussed. When the non-porosity component of the NMR data bitstream is truncated at 30 bits (or 18 bits or any number of bits), invariably the portion of the bitstream that describes the last codeword is truncated. Because of the rapid decay of the transform coefficients (e.g., 8-10 yield a relatively high accuracy reconstruction of the NMR data when using the SVD-based methods, for example), the set of possible quantized SVD coefficient values that are consistent with the received bitstream at the surface can be enumerated, and the NMR echo train measurements for each one can be reconstructed. A small subset of these possible bitstream completions may lead to reconstructed porosity-normalized CPMG data values that are close to 1. This relatively small set of bitstream completions (and corresponding NMR data reconstructions) may be used to obtain a truncation error correction. As the bit budget for the porosity-normalized NMR echo train data decreases to 18 or 12 bits, for example, this truncation error correction mechanism may become increasingly desirable.

In an example, there are 96 possible sets of code words that are consistent with the received bitstream. These are enumerated on the x-axis of the graph 73 in FIG. 4. For each of these possible bitstream completions, the NMR measurements may be reconstructed and their early time CPMG values may be assessed, as shown on the y-axis. It is noted that among the possible symbol streams are the symbol stream associated with the untruncated data 75 and the symbol stream that could be constructed from the truncated bitstream using the symbol frequency table 74. There are just 9 symbol streams which lead to acceptable CPMG reconstructions as shown by the diamond markers, some of which are indicated by 78. For this example, the truncation error correction mechanism produces the error corrected NMR data by averaging together the NMR data associated with this small set of acceptable symbol streams.

This truncation error correction mechanism can make a relatively large difference for the T2 probability distributions functions (PDFs) derived at above the subterranean formation 21 or at the surface, for example.

Figure 3:
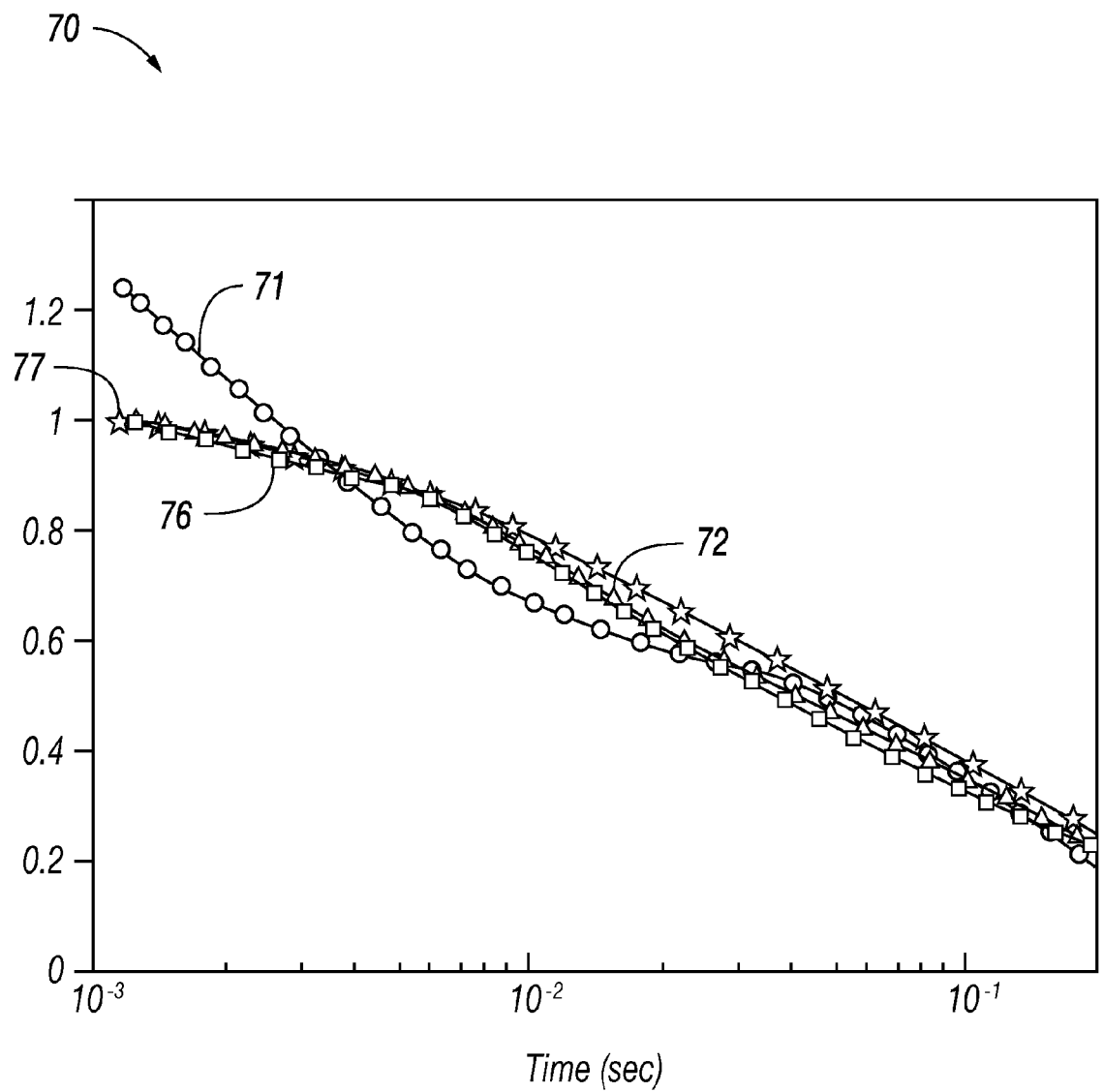
FIG. 3 is a graph of reconstructed CPMG measurements from three candidate bitstreams according to an embodiment along with original CPMG measurements encoded in the subterranean formation.
Figure 4:
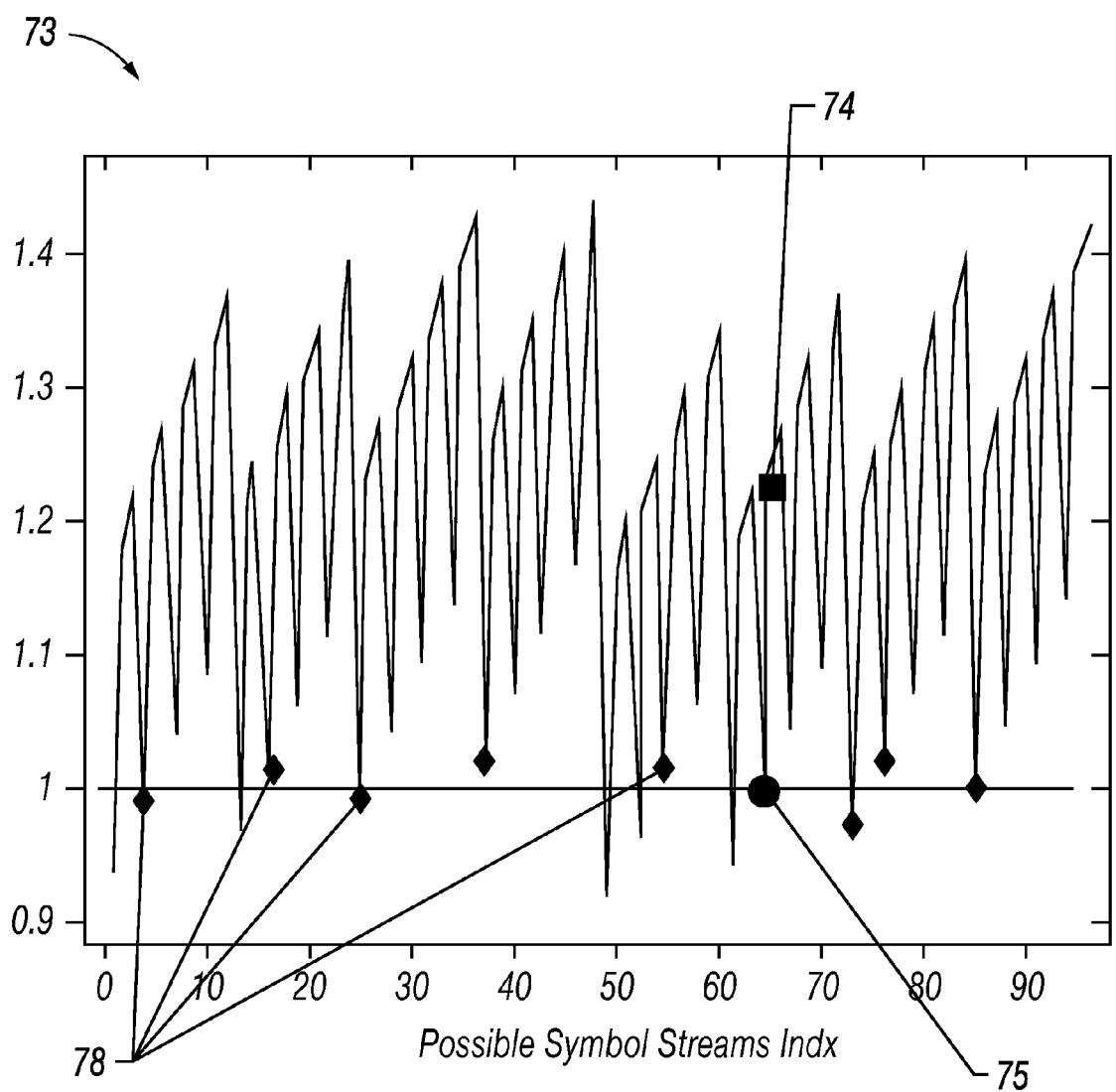
FIG. 4 is a graph of reconstructed CPMG values versus possible codeword completions in accordance with an embodiment.
Figure 5:
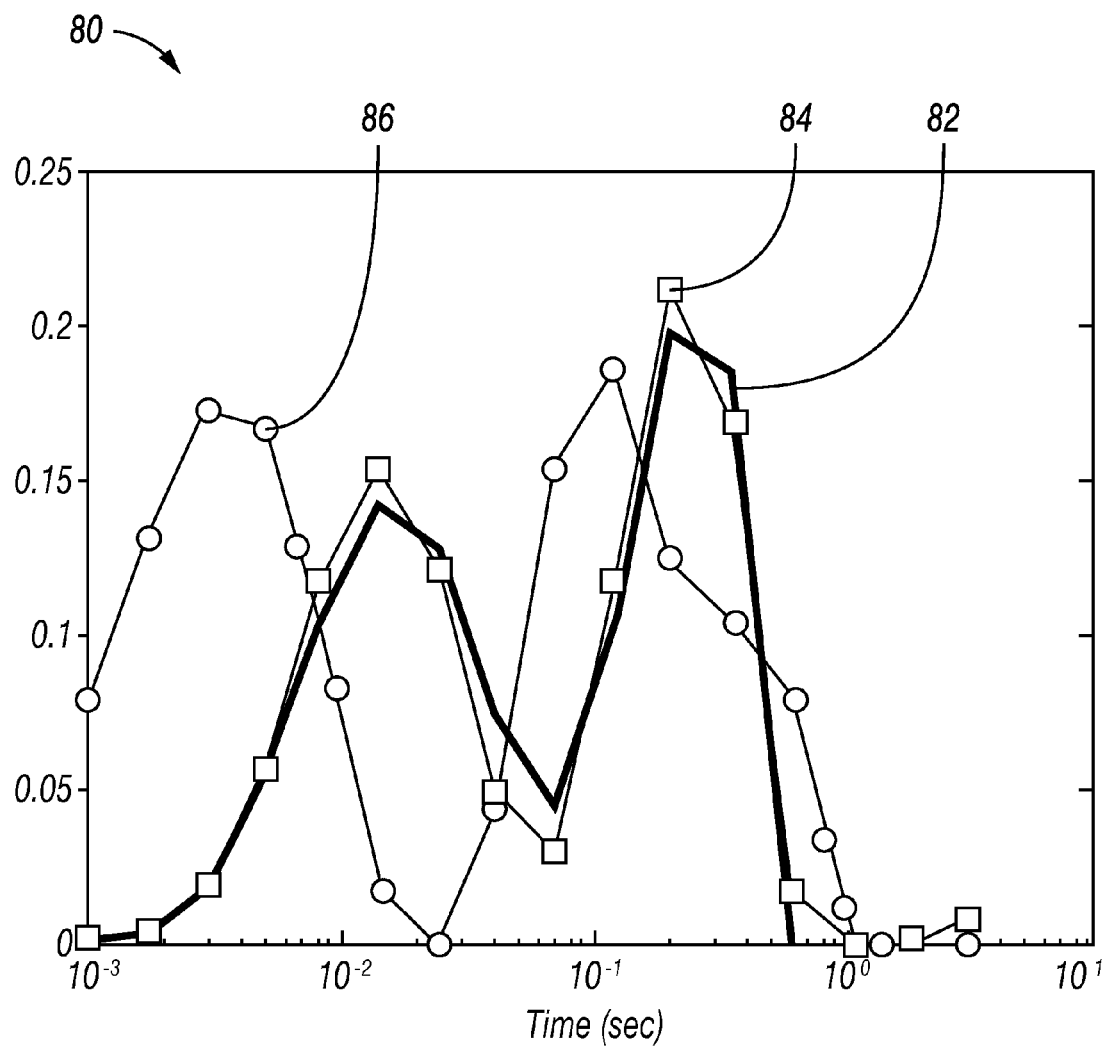
FIG. 5 is a graph of T2 probability density functions derived from the data in the graph of FIG. 4 and with and without error-correction.

Referring to the graph 80 in FIG. 5, the T2 PDFs that correspond to the symbol streams shown in the graph FIG. 4 are shown. The curve 82 represents original NMR measurements, the curve 84 represents data reconstructed from a truncated bitstream after error-correction, and the curve 86 represents data reconstructed from a truncated bitstream using the symbol frequency table represented by 74 (FIG. 3). Indeed, using the truncation error correction mechanism or method described herein may lead to a significantly increased accuracy T2 distribution from the received NMR telemetry. Correcting the truncation error may lead to obtaining more accurate information from other NMR interpretations made at the surface or subterranean formation 21—bound fluid volume, fluid typing, fluid composition in terms of chain length distributions, etc.

Another type of transmission error is a bit error. For example, when a mud-pulse telemetry system is used to transmit the NMR data to above the subterranean formation 21 or to the surface, the MWD receiver assigns a confidence level to each bit. This confidence level is between 0 and 100%. For the bitstream belonging to the NMR scaled data, or more particularly, the porosity-normalized data, the set of possible bitstreams that agree with the received bitstream for all the high-confidence level bits may be considered. For each of these candidate bitstreams, the NMR measurements can be reconstructed and assessed as to whether the early CPMG values are close to the scale value of 1. Alternatively, the porosity estimates from the reconstructed porosity-normalized NMR data should have values approximately equal to the scale value 1. A small subset of the candidate bitstreams may have early CPMG values close to 1, and this small subset represents a relatively simple bit error correction. Additionally, the method described herein may also be used to detect bit errors.

Of course, there may be other error correction mechanisms that may be considered for use with the embodiments described herein. For example, when there are burst measurements, CPMG measurements may be reconstructed to forward model the burst measurements to assess whether the burst measurements are indeed consistent with the reconstructed CPMG measurements.

An example of bit error correction using according to an embodiment is now described. Suppose that the MWD receiver indicates that bits 5 & 12 of the 30 bits used to compress the non-porosity component of the NMR data may not be necessarily trustworthy. These bits of a received bitstream are indicated in bold below:

1 1 1 1 1 1 1 0 1 0 0 0 0 0 0 1 1 1 1 0 1 0 0 0 0 0 0 0 1 1

There are 4 candidate bitstreams that agree with the received bitstream at all locations other than bits 5 & 12.

| | |
|---|---|
| Candidate #1: | 1 1 1 1 0 1 1 0 1 0 0 0 0 0 0 1 1 1 1 0 1 0 0 0 0 0 0 0 0 1 1 |
| Candidate #2: | 1 1 1 1 0 1 1 0 1 0 0 1 0 0 0 1 1 1 1 0 1 0 0 0 0 0 0 0 0 1 1 |
| Candidate #3: | 1 1 1 1 1 1 1 0 1 0 0 0 0 0 0 1 1 1 1 0 1 0 0 0 0 0 0 0 0 1 1 |
| Candidate #4: | 1 1 1 1 1 1 1 0 1 0 0 1 0 0 0 1 1 1 1 0 1 0 0 0 0 0 0 0 0 1 1 |

Figure 6:
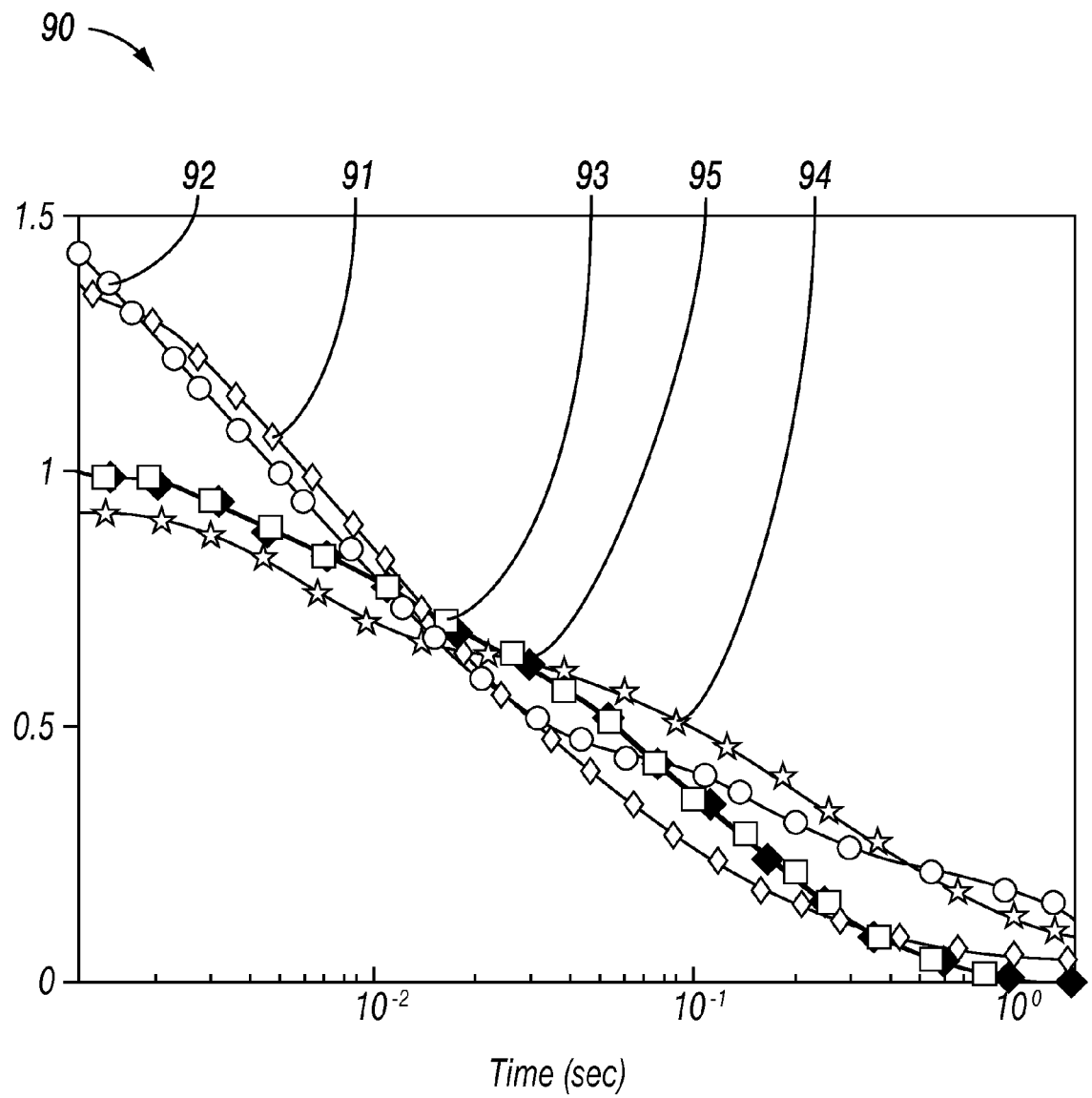
FIG. 6 is a graph of reconstructed CPMG measurements from four candidate bitstreams according to an embodiment along with original CPMG measurements encoded in the subterranean formation.

The NMR measurements may be reconstructed that correspond to these 4 bitstreams. The reconstructed CPMG measurements corresponding to the 4 bitstreams are illustrated by the curves 91, 92, 93, 94, respectively in the graph 90 in FIG. 6, along with the CPMG measurements that were encoded in the borehole 11 or within the subterranean formation 21. The "correct" curve is represented by the curve 95. Indeed, candidate bitstream 93 is the correct one, and bitstream 93 is the error corrected bit stream.

Another aspect is directed to a non-transitory computer-readable medium, for example, that may be included or part of the controller 31 above the subterranean formation 21. The non-transitory computer-readable medium may include computer-executable instructions configured to perform steps that include decoding, above the subterranean formation, both NMR data and NMR scaled data encoded and transmitted from a tool operated in a subterranean formation. The tool generates both the NMR data and the NMR scaled data based upon NMR measurements of the subterranean formation. The computer-executable instructions are also configured to perform steps that include performing error-correction of the decoded NMR data based upon the decoded NMR scaled data. Of course, the computer-executable instructions may also include other or additional instructions.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:

1. A method of obtaining nuclear magnetic resonance (NMR) data from a subterranean formation comprising:
  operating a tool in the subterranean formation for
    generating both the NMR data and NMR scaled data based upon a plurality of NMR measurements of the subterranean formation, and
    encoding and transmitting both the NMR data and the NMR scaled data, wherein the transmitting is performed over a wired connection;
  receiving and decoding, above the subterranean formation, both the NMR data and the NMR scaled data encoded and transmitted from the tool; and
  performing error-correction of the received and decoded NMR data based upon the received and decoded NMR scaled data wherein encoding the NMR scaled data comprises performing a transformation to generate a plurality of transform coefficients; and entropy encoding the plurality of transform coefficients to generate a plurality of code words; wherein a controller determines when a last codeword has been truncated and the error-correction is performed by estimating the last codeword by the controller and the error-correction for truncation uses single value decomposition techniques.

2. The method of claim 1, wherein generating the NMR data comprises generating NMR porosity data, and wherein generating the NMR scaled data comprises generating NMR porosity-scaled data.

3. The method of claim 1, wherein generating the NMR data comprises generating NMR porosity data, and wherein generating the NMR scaled data comprises generating NMR porosity-normalized data.

4. The method of claim 1, wherein generating the scaled NMR data comprises generating the scaled NMR data with respect to a scale value; and wherein performing the error-correction is based upon the decoded NMR scaled data being with ±10% of the scale value.

5. The method of claim 1, wherein performing the transformation comprises performing a linear transformation; and wherein the entropy encoding comprises Huffman encoding.

6. The method of claim 1, wherein performing the error-correction comprises performing bit error correction.

7. A system for obtaining nuclear magnetic resonance (NMR) data from a subterranean formation comprising:
a tool to be positioned in the subterranean formation to generate both the NMR data and NMR scaled data based upon a plurality of NMR measurements of the subterranean formation, and
encode and transmit both the NMR data and the NMR scaled data over a wired connection;
a controller to be positioned above the subterranean formation to receive and decode both the NMR data and the NMR scaled data encoded and transmitted from the tool, and perform error-correction of the received and decoded NMR data based upon the received and decoded NMR scaled data wherein encoding the NMR scaled data comprises performing a transformation to generate a plurality of transform coefficients; and entropy encoding the plurality of transform coefficients to generate a plurality of code words wherein the controller is configured to determine when a last codeword has been truncated and the error-correction is performed by estimating the last codeword by the controller and the error-correction for truncation uses single value decomposition techniques; and
a wired connection between the tool and the controller.

8. The system of claim 7, wherein the NMR data comprises NMR porosity data, and wherein the NMR scaled data comprises NMR porosity-scaled data.

9. The system of claim 7, wherein the NMR data comprises NMR porosity data, and wherein the NMR scaled data comprises NMR porosity-normalized data.

10. The system of claim 7, wherein the tool is to generate the scaled NMR data with respect to a scale value; and wherein said controller is to perform the error-correction based upon the decoded NMR scaled data being with ±10% of the scale value.

11. The system of claim 7, wherein the tool is to encode the NMR scaled data by at least performing a transformation to generate a plurality of transform coefficients, and entropy encoding the plurality of transform coefficients to generate a plurality of code words.

* * * * *